United States Patent [19]

Machii et al.

[11] 4,187,515
[45] Feb. 5, 1980

[54] SEMICONDUCTOR CONTROLLED RECTIFIER

[75] Inventors: Tetsuo Machii, Tokyo; Shuji Sugioka, Yokohama, both of Japan

[73] Assignee: Tokyo Shibaura Electric Co., Ltd., Kawasaki, Japan

[21] Appl. No.: 924,707

[22] Filed: Jul. 14, 1978

Related U.S. Application Data

[63] Continuation-in-part of Ser. No. 770,220, Feb. 18, 1977 and Ser. No. 601,184, Aug. 1, 1975, both abandoned, said Ser. No. 770,220 is a continuation-in-part of said Ser. No. 601,184.

[30] Foreign Application Priority Data

Aug. 15, 1974 [JP] Japan ............................... 49-93750

[51] Int. Cl.² ........................................ H01L 29/747
[52] U.S. Cl. ..................................... 357/39; 357/20; 357/86
[58] Field of Search ................... 357/20, 39, 38, 86

[56] References Cited

U.S. PATENT DOCUMENTS

| | | | |
|---|---|---|---|
| 3,280,386 | 10/1966 | Philips | 357/39 |
| 3,360,696 | 12/1967 | Neilson et al. | 357/39 |
| 3,391,310 | 7/1968 | Gentry | 357/39 |
| 3,443,171 | 5/1969 | Knott et al. | 357/39 |

Primary Examiner—Joseph E. Clawson, Jr.
Attorney, Agent, or Firm—Oblon, Fisher, Spivak, McClelland & Maier

[57] ABSTRACT

A semiconductor controlled rectifier of an asymmetrical construction which, only when supplied with a reverse surge voltage, is turned on in the reverse direction comprising a semi-conductor body having three contiguous regions forming an inner region of one conductivity type and two outer regions of the opposite conductivity type, a first external region of the one conductivity type provided adjacent a first one of said outer regions, a second external region of the one conductivity type provided adjacent a second one of said outer regions, said external regions being positioned in such a manner that a portion of each said outer regions is exposed, a cathode electrode in conductivity contact with said first external region, an anode electrode in conductive contact with said second external region and said exposed portion of the said second outer region, and a gate electrode in conductive contact with said exposed portion of first outer region, the cathode electrode and the second external region overlapping each other such that the overlapped area of the second external region is within a range of less than one half the area of the cathode electrode.

4 Claims, 16 Drawing Figures

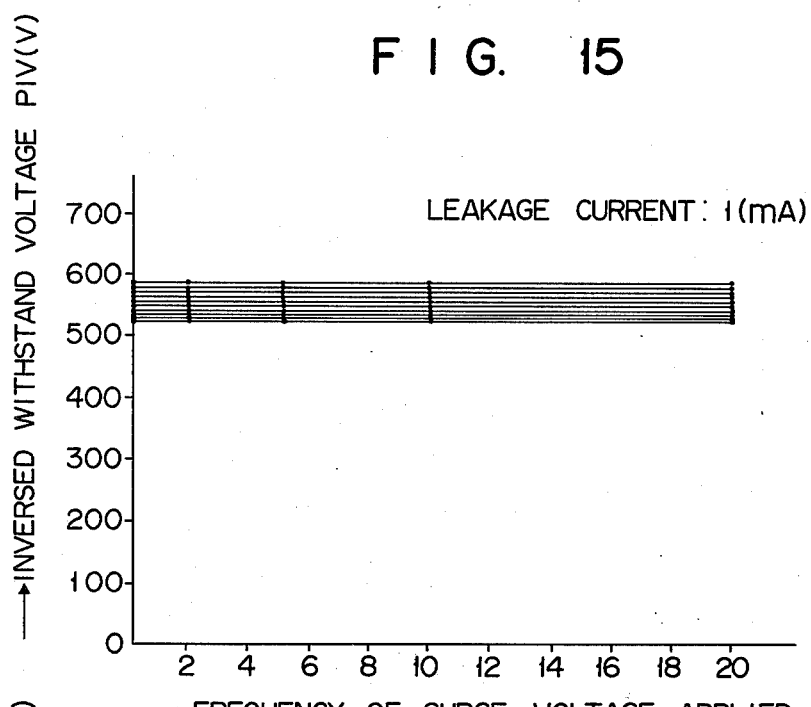
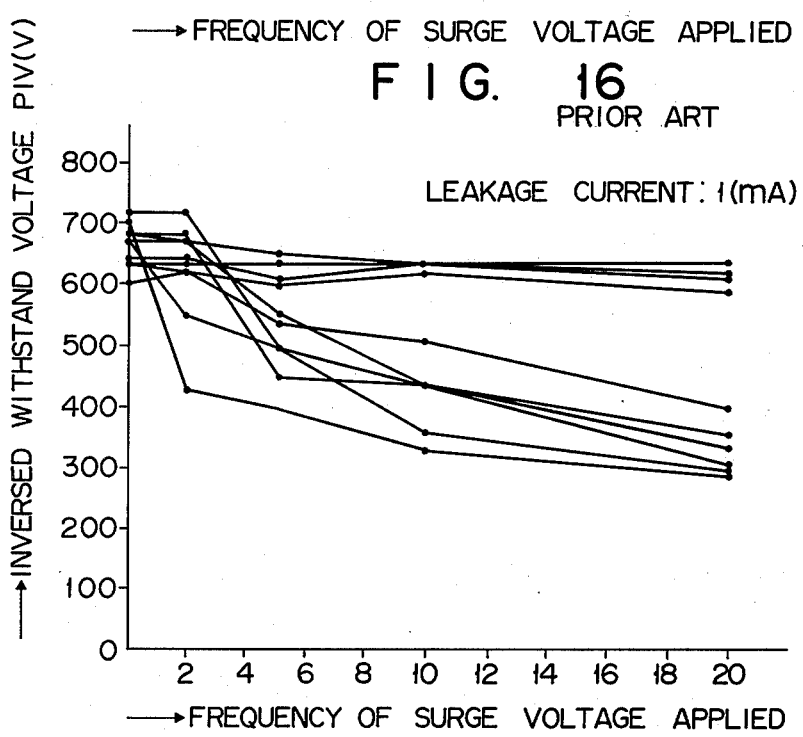

SEMICONDUCTOR CONTROLLED RECTIFIER

CROSS-REFERENCE TO RELATED APPLICATION

This is a continuation-in-part application of Ser. No. 770,220 filed Feb. 18, 1977 and Ser. No. 601,184 filed Aug. 1, 1975, abandoned, said Ser. No. 770,220 is a continuation-in-part of Ser. No. 601,184 abandoned and assigned to the same assignee as the present invention.

BACKGROUND OF THE INVENTION

This invention relates to a thyristor and more particularly to a thyristor so improved as to have the PN junctions saved from destruction even when an abnormal surge overvoltage is impressed on said thyristor.

Hitherto, a thyristor has been used in a state connected in series to a load. Where, however, an overvoltage caused by noises resulting from thunders or the intermittent operation of apparatus through which a large electric current passes is impressed on the thyristor in the backward direction, then the PN junctions of said thyristor are subject to destruction.

The prior art thyristor denoted by the general referential numeral 10, for example, in FIG. 1 comprises a semiconductor body consisting of four semiconductor layers 12, 14, 16, 18, the conductivity types of which alternately change in the order of PNPN and electrodes 20, 22, 24 mounted on three of said four semiconductor layers 12, 14, 16, 18. The electrode 20 formed on the semiconductor layer 18 disposed on one outer side of the body is a cathode electrode, the electrode 22 mounted on the semiconductor layer 12 positioned on the opposite outer side of the body is an anode electrode, and the electrode 24 set on the intermediate layer 16 lying between the semiconductor layers 14, 18 is a gate electrode.

A thyristor 10 is generally applied in a state connected, as shown in FIG. 2, in series to a load 30. If, in this case, overvoltage resulting from noises caused, for example, by thunders, is impressed on the thyristor in the backward direction, then the thyristor will possibly by destroyed. As seen from a curve of voltage-current characteristic given in FIG. 3, this undesirable event originates with the fact that, where surge overvoltage is impressed on a thyristor in the forward direction, then the subsequent voltage drop in the operated thyristor remains small, thus minimizing power loss resulting from the surge overvoltage, but that, where surge overvoltage is impressed on the thyristor in the backward direction, then a large current caused by the surge overvoltage flows through the thyristor with both ends thereof impressed with a voltage equal to its withstand voltage PIV, leading to prominent power loss in the thyristor. Referring to the circuit of FIG. 2, let it be assumed that with the breakover voltage of the thyristor set at $V_{BO}=PIV=500$ V, the holding current $I_H$ at 10 mA, and the load 30 at 20Ω units, a surge overvoltage having a peak value of 2500 V is impressed on the thyristor in the forward direction. If, in this case, forward voltage drop in the operated thyristor can be disregarded, then the thyristor will receive surge power having a peak value of 500 V×10 mA=5 W. Conversely, where surge overvoltage is impressed on the thyristor in the backward direction, then the thyristor will be supplied with surge power of 500 V×(2500 V−500 V)/20 Ω=50,000 W. Such backward impression of surge overvoltage results in heavy power loss in the thyristor and consequently its eventual destruction.

As an element adapted to be turned ON or OFF either in the forward or in the backward direction, Triode AC switch (TRIAC) is known which has been developed by General Electric Company. As shown in FIG. 4, TRIAC 40 comprises a semiconductor body consisting of an intermediate N type semiconductor layer 42, P-type semiconductor layers 44 and 46 formed adjacent to both surfaces of the intermediate layer 42, an N-type semiconductor layer 48 formed in the P-type semiconductor layer 48 in a manner to have its one surface exposed, and N-type semiconductor layers 50 and 52 formed in the P-type semiconductor layer 46 in a manner to have its one surface exposed; and electrodes 54, 56 and 58 formed on the outer surfaces of the semiconductor body and having terminals $T_2$, G and $T_1$, respectively.

The voltage-current characteristic curve of TRIAC is shown in FIG. 5. As will be evident from FIG. 5 TRIAC is an element capable of controlling an alternating current. FIG. 6 shows the equivalent circuit in which a pair of thyristors are connected in parallel with, and in a polarity-reversed relationship to, each other. In consequence, even when a surge voltage is applied in the backward direction, TRIAC is prevented from being destroyed. Since, however, TRIAC is turned ON even by applying a gate signal in the backward direction, the element is not so operated that it is turned ON only when a surge voltage is applied in the backward direction.

SUMMARY OF THE INVENTION

It is accordingly the object of this invention to provide a thyristor which can prevent destruction by a backward surge voltage without lowering a forward current carrying capability to an appreciable extent and which is not turned ON even when a backward gate signal is applied.

According to this invention there is provided a semiconductor controlled rectifier of an asymmetrical construction which, only when supplied with a reverse surge voltage, is turned on in the reverse direction comprising a semiconductor body having three contiguous regions forming an inner region of one conductivity type and two outer regions of the opposite conductivity type, a first external region of the one conductivity type provided adjacent a first one of said outer regions, a second external region of the one conductivity type provided adjacent a second one of said outer regions, said external regions being positioned in such a manner that a portion of each said outer regions is exposed, a cathode electrode in conductive contact with said first external region, an anode electrode in conductive contact with said second external region and said exposed portion of the said second outer region, and a gate electrode in conductive contact with said exposed portion of first outer region, the cathode electrode and the second external region overlapping each other such that the overlapped area of the second external region is within a range of less than one half the area of the cathode electrode.

BRIEF DESCRIPTION OF THE DRAWING

FIG. 15 shows the withstand voltage characteristic of the thyristor of this invention shown in FIG. 10; and FIG. 16 indicates the withstand voltage characteristic of the prior art thyristor shown in FIG. 1.

DETAILED DESCRIPTION OF THE PREFERRED EMBODIMENTS

Figure 1:
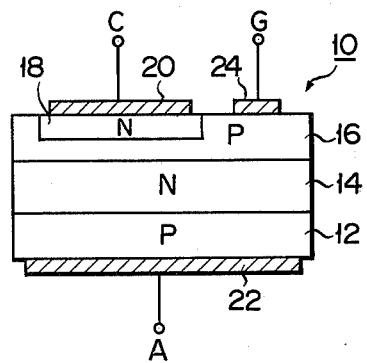
FIG. 1 is a longitudinal sectional view of the prior art thyristor showing its construction.

There will now be described by reference to FIG. 7. A thyristor 60 according to this invention comprises a semiconductor body prepared by providing an anode layer 62, intermediate layer 64, gate layer 66, and cathode layer 68 with their conductivity types alternately arranged in the order of PNPN, said cathode layer 68 being embedded in the gate layer 66 and having its surface exposed to the outside.

An N type auxiliary semiconductor layer 72 is formed in the anode layer 62. An anode electrode 74 is formed on the major surface of the body on the anode layer side so as to extend over the above-mentioned portion 70 of other anode layer 62 and N type auxiliary semiconductor layer 72. A gate electrode 76 is formed only on that portion of the gate layer 66 which is exposed to the major surface of the semiconductor body on the cathode layer side. A cathode electrode 76 is mounted on that portion of the cathode layer 68 which is exposed to said major surface. The characters A, G, C represent the terminals of the anode, gate and cathode electrodes 108, 109, 110 respectively. The auxiliary semiconductor layer 72 is arranged in the anode layer 62 around the periphery of that portion 70 of the anode layer 62 which aligns with the cathode electrode 76. That is, the cathode layer 76 does not overlap the auxiliary semiconductor layer 72. According to the embodiment of FIG. 7, the anode electrode 74 extends over part of said auxiliary semiconductor layer 72. However, the anode electrode 74 may extend, for example, all over the auxiliary semiconductor layer 72 or beyond it up to the outer periphery of the major surface of the anode layer 72.

Figure 3:
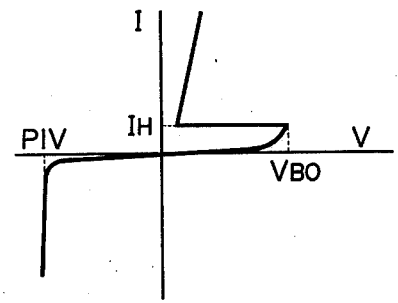
FIG. 3 is a curve diagram showing the voltage-current characteristic of the prior art thyristor between the anode and cathode.
Figure 4:
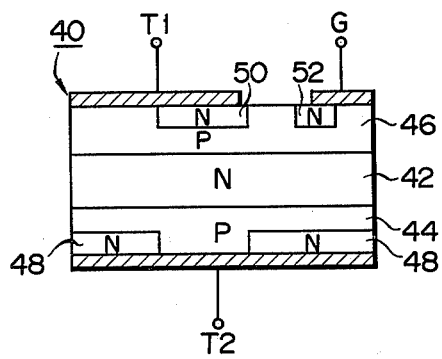
FIG. 4 is a view showing the structure of a triode AC switch.
Figure 5:
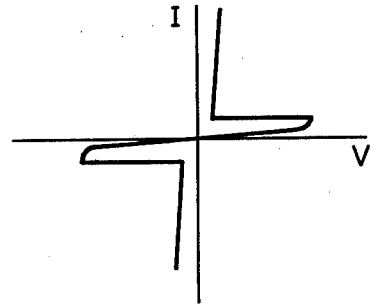
FIG. 5 is a graph showing the voltage-current characteristic of the triode AC switch in FIG. 4.
Figure 8:
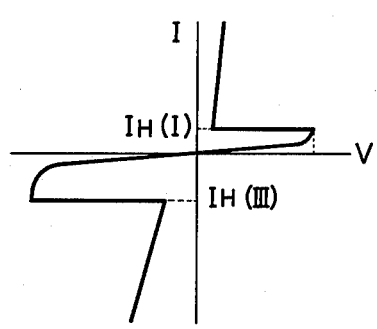
FIG. 8 is a graph showing the voltage-current characteristic of the thyristor in FIG. 7.

One process of preparing the subject thyristor with the above-mentioned construction may be effected as follows. First, impurities are dispersed in an N type semiconductor substrate from both front and back sides to form the gate layer 66 and anode layer 62 respectively. Impurities are diffused in the substrate similarly from both front and back sides to provide the cathode layer 68 and auxiliary semiconductor layer 72. Thereafter, aluminium is evaporated on the selected regions to form the anode, gate and cathode electrodes 74, 76, 78. The voltage-current characteristic between the anode and cathode of the thyristor 60 of this invention constructed as described above presents such a pattern as shown in FIG. 8. Comparison between the voltage-current characteristic of FIG. 8 and that of FIG. 3 shows that said characteristics in the forward direction in the respective first quadrants of both figures are exactly the same, whereas, in the case of the backward direction, said characteristic in the third quadrant of FIG. 8 has a negative resistance region relatively the same as that of the first quadrant of FIG. 8. The reason is that, where voltage is impressed on the thyristor of this invention in the forward direction, then the P-type anode layer 62, N-type intermediate layer 64, P-type gate layer 66 and N-type cathode layer 68 jointly act as a thyristor and, where voltage is impressed on said thyristor in the backward direction, then the N-type cathode layer 68, P-type gate layer 66, N-type intermediate layer 64, P-type anode layer 62 and N-type auxiliary semiconductor layer 72 collectively function as a thyristor. Since the backward voltage-current characteristic of the thyristor of this invention presents the pattern shown in the third quadrant of FIG. 8, when the thyristor is impressed with abnormal surge overvoltage in the backward direction, the thyristor is turned on to permit a voltage drop in said thyristor to remain small, preventing the PN junctions thereof from being destroyed. The voltage-current characteristic of the first quadrant of FIG. 8 is relatively similar to that of the third quadrant thereof, but not exactly symmetrical therewith. The reason is that the backward current path of the thyristor presents a voltage drop larger by an amount of resistance occurring in the junction 80 between the gate and cathode layers 66, 68 than in the forward current path.

Figure 7:
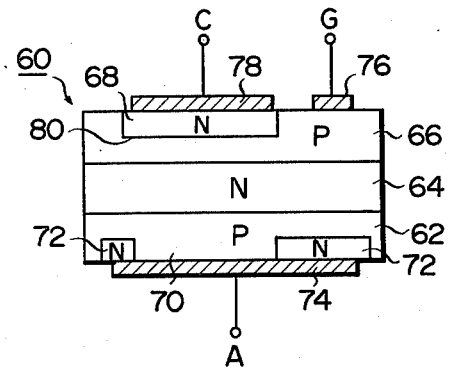
FIG. 7 is a view showing a thyristor according to one embodiment of this invention.
Figure 6:
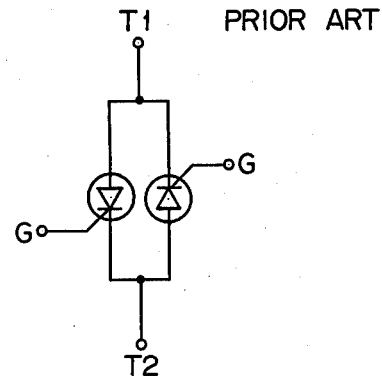
FIG. 6 shows the equivalent circuit of the triode AC switch in FIG. 4.
Figure 9:
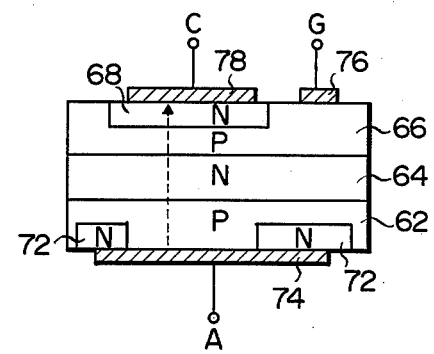
FIGS. 9 and 10, each, show a current path in the thyristor in FIG. 7.
Figure 10:
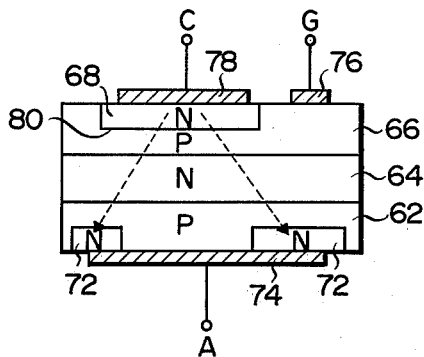
Figure 11:
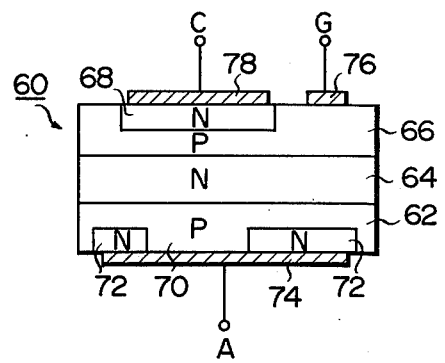
FIGS. 11 to 14, each, show a thyristor according to another embodiment of this invention.

FIGS. 9 and 10 show the backward current path, respectively, of the thyristor in FIG. 7. As will be evident from FIG. 9, in order to elevate the forward current carrying capability the auxiliary layer 72 in the anode layer 62 should preferably be located in any other portion of the anode layer 62 other than that which does not overlap the cathode electrode 78. In addition, the auxiliary layer 72 be preferred to have a small area. To elevate the forward current carrying capability and lower the backward holding current the auxiliary layer 72 is formed in a closed loop which is made broad at the part which overlaps the gate electrode 76. It may be contemplated to extend the periphery of the auxiliary semiconductor layer 72 up to the side walls of the semiconductor body. Since, however, such arrangement gives rise to a channel, resulting in the decreased withstand voltage of the thyristor, it is preferred to form the auxiliary semiconductor layer 72 on the major surface of the body on the anode layer side. The reason why the gate electtode 76 should be connected to the gate layer 66 alone is that if a different N-type layer from the N-type cathode layer 68 is formed in the P-type gate layer 66 and the gate electrode 76 is also connected to said different N-type layer, then the thyristor will be made equivalent to TRAIAC, and is also operated in the backward direction when supplied with a gate signal, eventually losing its function. There is a possibility that an external, great surge voltage is applied to the thyristor dependent upon the requirements of a load 30 connected in series to the thyristor. As shown in FIG. 11, in order to elevate the backward current carrying capability and prevent an element destruction the auxiliary layer 72 may be formed in that portion of the anode layer 62 which overlaps the cathode electrode 78. If in this case the overlapped area of the auxiliary layer 72 exceeds one half the area of the cathode electrode 78, the forward current carrying capability is lowered, leading to a possible destruction of the element by a forward surge voltage. For this reason, the overlapped area of the auxiliary layer 72 must be restricted to less than one half the area of the cathode electrode 78.

Figure 12:
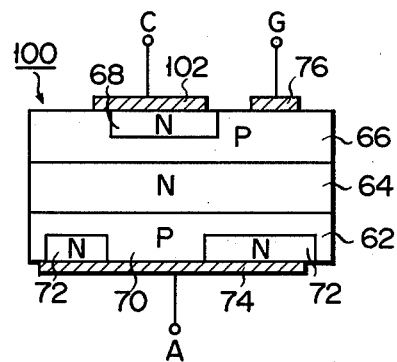

FIG. 12 sets forth a thyristor 100 according to another embodiment of this invention. This embodiment has substantially the same construction as that of FIG. 7, excepting that a cathode electrode 102 extends over the cathode layer 68 and the gate layer 66. Therefore, the parts of FIG. 12 the same as those of FIG. 7 are denoted by the same numerals and description thereof is omitted.

A thyristor 100 according to the embodiment to FIG. 12 is the so-called shorted emitter type in which the cathode electrode 102 extends over the cathode layer 68 and gate layer 66. According to the embodiment of FIG. 12 in which the auxiliary semiconductor layer 72 is formed on that portion of the anode layer 62 which overlaps the portion of the gate layer 66 contacting the cathode electrode 102, a voltage drop in the thyristor remains small even when surge overvoltage is impressed on the thyristor in the backward direction, desirably minimizing power loss therein. That portion of the cathode electrode 102 which contacts the gate layer 66 has a far smaller area than that portion 70 of the anode layer 62 contacting the anode electrode 74 which overlaps the cathode electrode 102. The function of the embodiment of FIG. 12 and the remainder of the construction thereof are the same as that of FIG. 7.

Figure 13:
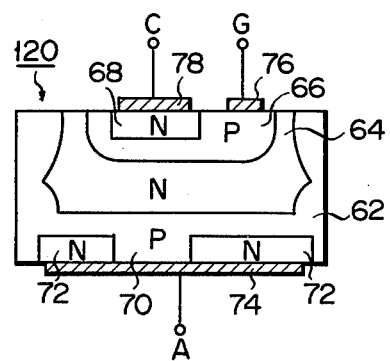

FIG. 13 illustrates the construction of a planer type thyristor 120 according to this invention. The parts of FIG. 13 the same as those of the preceding embodiment of FIG. 7 are denoted by the same numerals, and description tereof is omitted. According to the embodiment of FIG. 13, an N-type intermediate layer 64 which is partly exposed to the major surface of the body on the cathode layer side is made to overlap the auxiliary semiconductor layer 72 to increase the forward current carrying capability of the thyristor and decrease the holding current $I_H$(III) in the third quadrant of FIG. 8 showing the voltage-current characteristic of the thyristor, thereby more minimizing power loss in the thyristor due to impression of surge overvoltage thereon. The reason is that the planar type thyristor has a large construction than that of FIG. 7 by that portion of the N-type intermediate layer 64 which is exposed to the major surface of the substrate on the cathode layer side, enabling the current carrying capability of the thyristor to be increased by that extent. The function of the embodiment of FIG. 13 and the remainder of the construction thereof are the same as those of the preceding embodiments of FIGS. 7 and 12 and description thereof is omitted.

Figure 14:
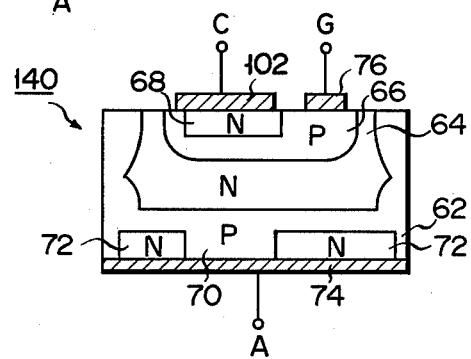

FIG. 14 is the so-called shorted emitter type thyristor modified from the embodiment of FIG. 13 by causing the cathode electrode 102 to extend over the cathode layer 68 and gate layer 66. The embodiment of FIG. 14 has the same function and effect as that of FIG. 12, and description thereof is omitted. The parts of FIG. 14 the same as those of the preceding embodiment of FIG. 12 are denoted by the same numerals.

The specification of this invention describes a thyristor whose body is formed of an anode layer, intermediate layer, gate layer and cathode layer with their conductivity types alternately arranged in the order of PNPN. Obviously, however, the concept of the invention is also applicable to a thyristor whose body consists of the same layers with their conductivity types arranged in the order of PNPN.

There will now be described comparison between the prior art thyristor and that of this invention with respect to the relationship between the number of times both types of thyristor are impressed with the same amount of surge overvoltage and decreases in the withstand voltage of said thyristors.

Figure 2:
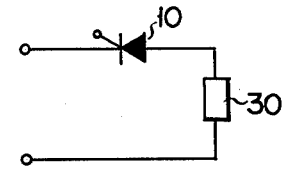
FIG. 2 shows a load circuit using a thyristor.

FIG. 15 presents decreases in the withstand voltage of the thyristor 120 of this invention shown in FIG. 13. FIG. 16 indicates decreases in the withstand voltage of the prior art thyristor 10 illustrated in FIG. 1. The experimental results of FIGS. 15 and 16 refer to the case where, in the circuit of FIG. 2, the load 30 had a resistance of 20Ω units, and a surge overvoltage having a since wave of 10 ms was applied a number of times at an interval of 0.5 second with a peak value of 2500 V each time. Comparison between the voltage-current characteristics of the prior art thyristor 10 and the thyristor 120 of this invention shows that where impressed twice with surge overvoltage, the prior art thyristor 10 presented a noticeable decrease in its withstand voltage, but that the thyristor 120 of this invention constructed as shown in FIG. 13 did not indicate any decrease in its withstand voltage even when impressed continually twenty times with the same amount of surge overvoltage as applied to the prior art thyristor 10.

As mentioned above, the thyristor of this invention is provided with an auxiliary semiconductor layer so as to minimize a voltage drop at both ends of the thyristor even when surge overvoltage is impressed thereon in the backward direction, minimizing pwoer loss in the thyristor and consequently preventing the PN junctions thereof from being destroyed.

What we claim is:

1. A semiconductor controlled rectifier of an asymmetrical construction which, only when supplied with a reverse surge voltage, is turned ON in the reverse direction comprising a semiconductor body having three contiguous regions forming an inner region of one conductivity type and two outer regions of the opposite conductivity type, a first external region of the one conductivity type provided adjacent a first one of said outer regions, a second external region of the one conductivity type provided adjacent a second one of said outer regions and partially overlapping said first external region, said external regions being positioned in such a manner that a portion of each said outer regions is exposed, a cathode electrode formed on only said first external region, an anode electrode formed on said second external region and said exposed portion of the said second outer region, and a gate electrode in conductive contact with said exposed portion of first outer region alone, said cathode electrode and said second external region overlapping each other such that the overlapped area of the second external region is within a range of less than one half the area of the cathode electrode.

2. The semiconductor controlled rectifier according to claim 1 wherein the semiconductor body is of the planar type.

3. The semiconductor controlled rectifier according to claim 1 wherein the second external region is provided in a closed loop form.

4. The semiconductor controlled rectifier according to claim 1, wherein the gate electrode overlaps the second external region.

* * * * *